United States Patent
Hong et al.

(10) Patent No.: US 12,108,683 B2
(45) Date of Patent: Oct. 1, 2024

(54) MAGNETIC TUNNEL JUNCTION DEVICE AND OPERATING METHOD THEREFOR

(71) Applicant: IUCF-HYU (INDUSTRY-UNIVERSITY COOPERATION FOUNDATION HANYANG UNIVERSITY), Seoul (KR)

(72) Inventors: Jin Pyo Hong, Seoul (KR); Jeong Hun Shin, Seoul (KR); Yoon Seong Choi, Goyang-si (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 118 days.

(21) Appl. No.: 17/796,102

(22) PCT Filed: Jan. 8, 2021

(86) PCT No.: PCT/KR2021/000235
§ 371 (c)(1),
(2) Date: Jul. 28, 2022

(87) PCT Pub. No.: WO2021/153920
PCT Pub. Date: Aug. 5, 2021

(65) Prior Publication Data
US 2023/0083328 A1  Mar. 16, 2023

(30) Foreign Application Priority Data

Jan. 28, 2020  (KR) .................. 10-2020-0010123

(51) Int. Cl.
*H10N 50/10* (2023.01)
*G11C 11/16* (2006.01)
(Continued)

(52) U.S. Cl.
CPC .......... *H10N 50/10* (2023.02); *G11C 11/161* (2013.01); *G11C 11/1675* (2013.01);
(Continued)

(58) Field of Classification Search
None
See application file for complete search history.

(56) References Cited

U.S. PATENT DOCUMENTS

2010/0321993 A1  12/2010  Nikonov et al.
2011/0044096 A1*  2/2011  Li .................. H01L 21/67011
                                                    365/158
(Continued)

FOREIGN PATENT DOCUMENTS

KR  10-2014-0099886 A  8/2014
KR  10-2016-0089567 A  7/2016
(Continued)

OTHER PUBLICATIONS

International Search Report of PCT/KR2021/000235 dated Mar. 26, 2021 [PCT/ISA/210].

*Primary Examiner* — Tan T. Nguyen
(74) *Attorney, Agent, or Firm* — Sughrue Mion, PLLC

(57) ABSTRACT

A magnetic tunnel junction device and an operating method thereof are disclosed. The magnetization switching of a free layer may be induced through spin orbit torque or spin transfer torque, and a magnetization direction of a pinned layer may be easily set according to the intention of a designer through ferromagnetic coupling and antiferromagnetic coupling.

17 Claims, 3 Drawing Sheets

(51) Int. Cl.
*H10B 61/00* (2023.01)
*H10N 50/80* (2023.01)
*H10N 50/01* (2023.01)

(52) U.S. Cl.
CPC .............. *H10B 61/00* (2023.02); *H10N 50/80* (2023.02); *H10N 50/01* (2023.02)

(56) References Cited

U.S. PATENT DOCUMENTS

| | | | | |
|---|---|---|---|---|
| 2018/0013059 | A1* | 1/2018 | Hong | H01F 10/123 |
| 2020/0013444 | A1* | 1/2020 | Min | H01F 10/3272 |
| 2020/0185595 | A1* | 6/2020 | Le | G11C 11/161 |
| 2020/0266236 | A1* | 8/2020 | Gottwald | H10N 50/85 |
| 2021/0320245 | A1* | 10/2021 | Kalitsov | H10N 50/10 |

FOREIGN PATENT DOCUMENTS

| | | |
|---|---|---|
| KR | 10-2017-0000410 A | 1/2017 |
| KR | 10-2017-0113717 A | 10/2017 |

\* cited by examiner

[FIG. 1]
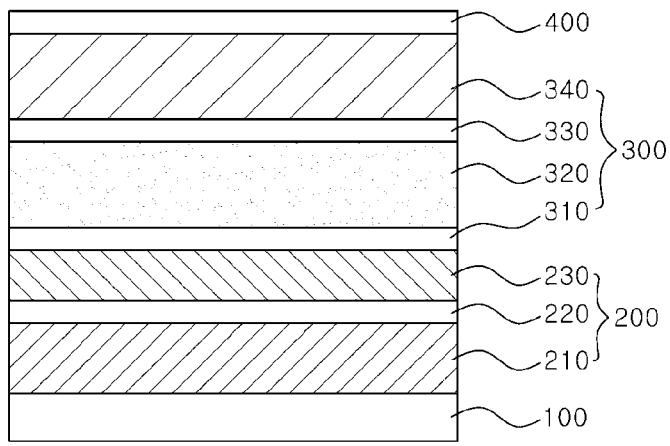
[FIG. 2]
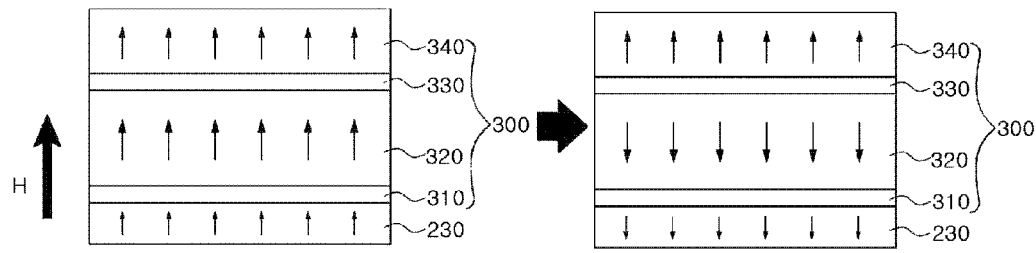
[FIG. 3]
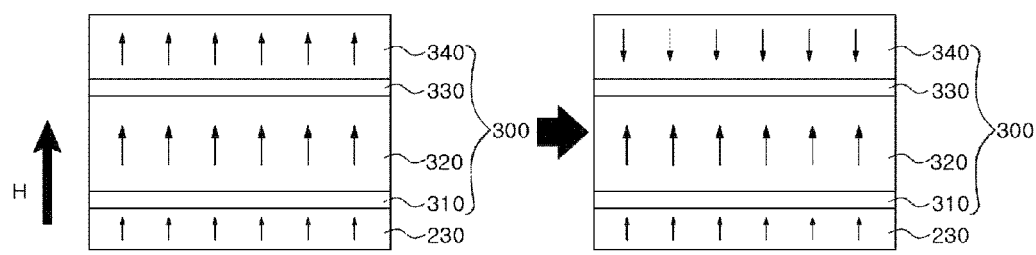

[FIG. 4]
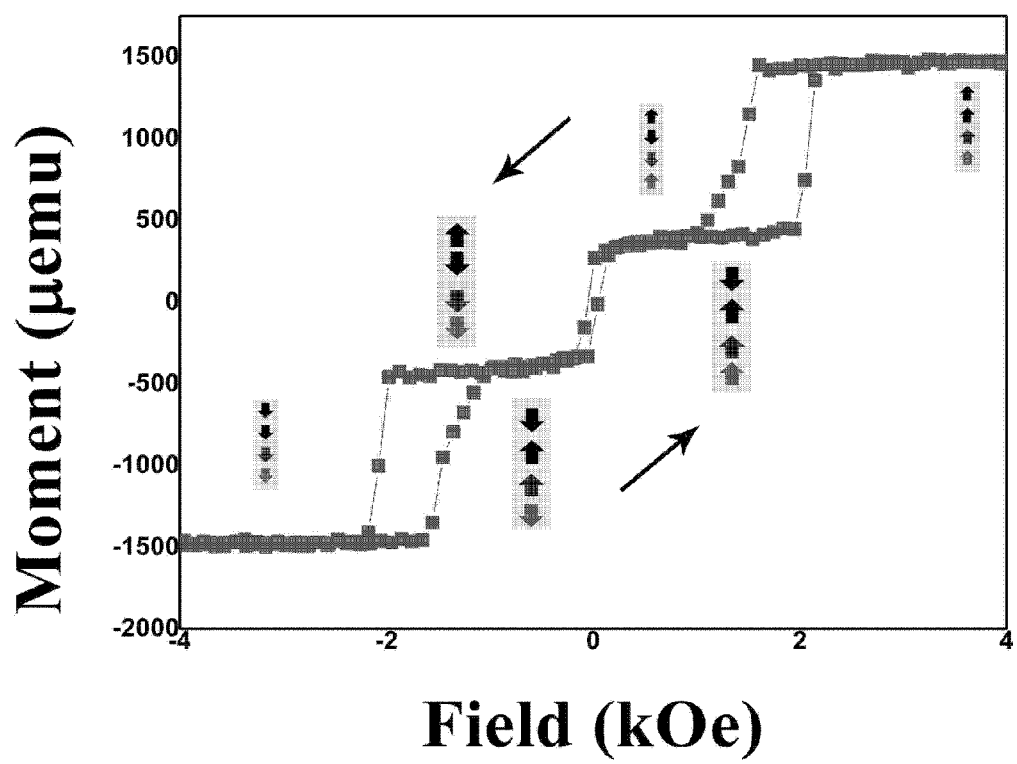

[FIG. 5]
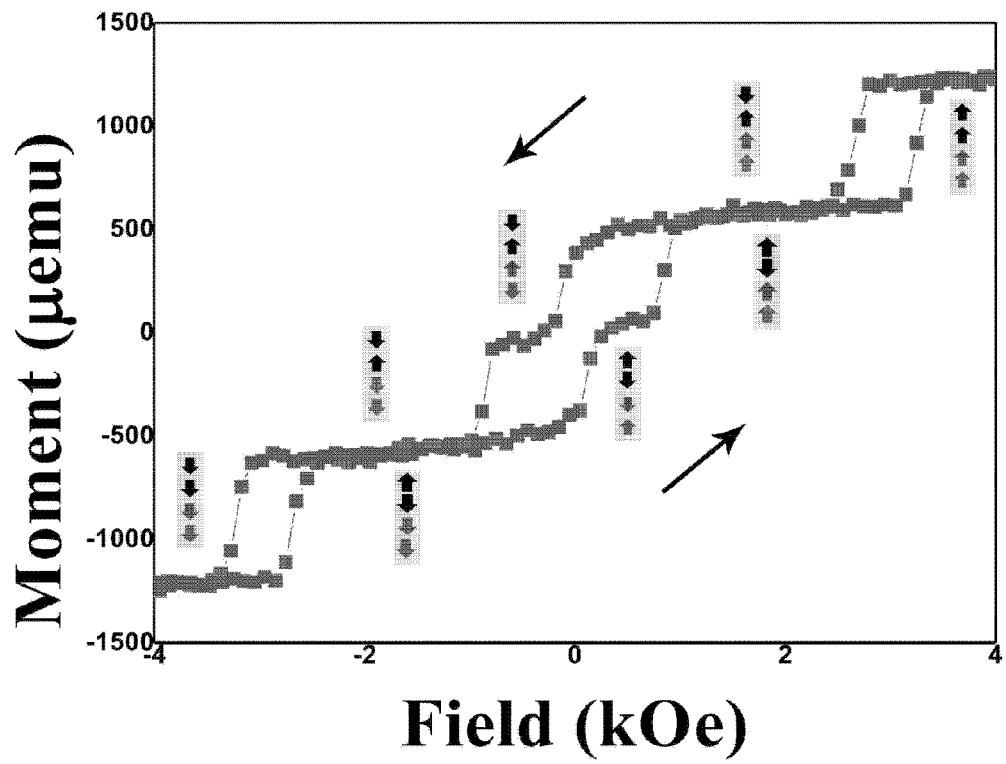
[FIG. 6]
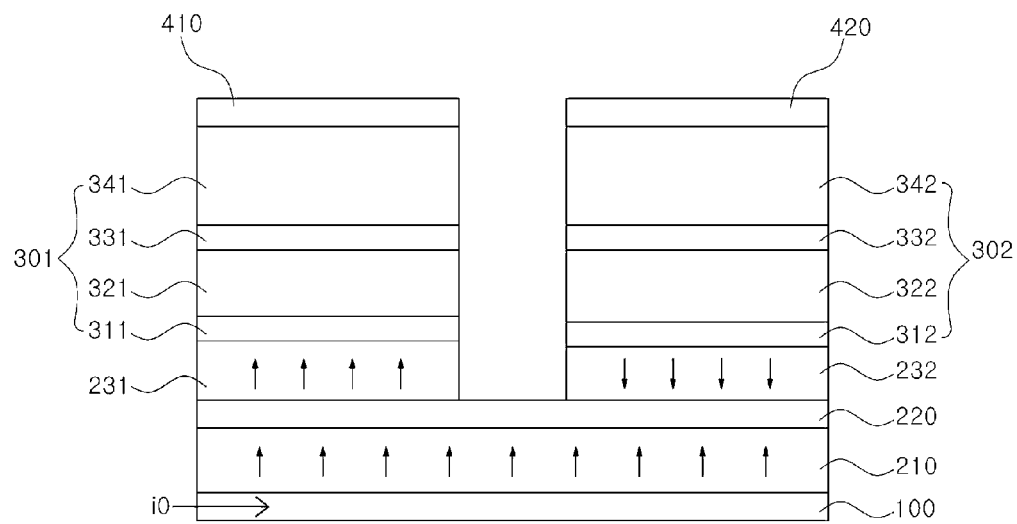

MAGNETIC TUNNEL JUNCTION DEVICE AND OPERATING METHOD THEREFOR

CROSS REFERENCE TO RELATED APPLICATIONS

This application is a National Stage of International Application No. PCT/KR2021/000235 filed on Jan. 8, 2021, claiming priority based on Korean Patent Application No. 10-2020-0010123 filed on Jan. 28, 2020.

TECHNICAL FIELD

The present invention relates to a magnetic tunnel junction structure, and more specifically, to a magnetic tunnel junction device capable of complementarily setting magnetization of a pinned layer and an operating method thereof.

BACKGROUND ART

A magnetic tunnel junction used as an important element of a magnetic memory (MRAM) has a free layer, a tunnel barrier layer, and a pinned layer. The resistance of a magnetic tunnel junction structure is determined by a parallel state or an antiparallel state of magnetization directions of the free layer and the pinned layer. A change in resistance is interpreted as a change in a storage state of the memory, and information is stored in a unit cell of the memory through the change in the resistance state.

A magnetization changing operation in the free layer is performed by spin transfer torque or spin orbit torque.

The spin transfer torque is interpreted as a reaction by torque in which a magnetization direction of conduction electrons is changed according to a magnetization direction in a magnetic metal. The spin transfer torque can be applied to a magnetic tunnel junction structure in which an insulator is inserted between two magnetic metal layers, which electrons pass through by quantum tunneling.

The spin orbit torque is due to a phenomenon in which moving electrons feel as if there is a magnetic field even in the absence of a magnetic field according to the special theory of relativity, and the electrons have spin orbit binding energy.

In the magnetic tunnel junction structure, a low-resistance state and a high-resistance state are realized using the magnetization changing operation of the free layer. Further, the free layer faces the pinned layer with the tunnel barrier layer in the center thereof. The pinned layer has a property in that the magnetization direction is not changed even when an external magnetic field or spin current is introduced. A method of fixing magnetization in the pinned layer is heat treatment and application of a very strong external magnetic field. Further, a synthetic antiferromagnet is formed under the pinned layer or on the pinned layer, and a non-magnetic metal layer is disposed between the synthetic antiferromagnet and the pinned layer. The synthetic antiferromagnet is magnetically coupled to the pinned layer through the non-magnetic metal layer. Accordingly, when an external magnetic field of 1000 Oe or more is applied in a heat treatment operation, magnetization of the synthetic antiferromagnet can be fixed, and the magnetization of the magnetically coupled pinned layer can be set.

The magnetization fixed in the synthetic antiferromagnet is not changed even after application of the external magnetic field or current. Accordingly, the magnetization of the pinned layer magnetically coupled to the synthetic antiferromagnet is also not changed.

However, in a device manufacturing process, pinned layers having various magnetization states are frequently required. That is, a pinned layer having upward magnetization may be required, and a pinned layer having downward magnetization may also be required. In the case of following a magnetization fixing process of the above-described conventional pinned layer, since the external magnetic field can be applied in only one direction in the heat treatment operation, the pinned layers have magnetization in the same direction in a plurality of magnetic tunnel junction structures. This becomes a very big constraint for a designer of the device.

DISCLOSURE

Technical Problem

A first technical object of the present invention is to provide a magnetic tunnel junction device capable of controlling the magnetization of a pinned layer through a magnetization induction unit which varies magnetization intensity.

A second technical object of the present invention is to provide an operating method of the magnetic tunnel junction device provided by the first technical object.

Technical Solution

The present invention for achieving the above-described first technical object provides a magnetic tunnel junction device including: a magnetic tunnel junction unit forming a magnetic tunnel junction of a free layer, a tunnel barrier layer, and a pinned layer formed on a lower electrode; a magnetization induction unit formed on the magnetic tunnel junction unit, having ferromagnetic coupling and antiferromagnetic coupling, and configured to determine a fixed magnetization of the magnetic tunnel junction unit; and an upper electrode formed on the magnetization induction unit.

The first technical object of the present invention is achieved by providing a magnetic tunnel junction device including: a free layer formed on a lower electrode; a tunnel barrier layer formed on the free layer; a first pinned layer formed at one side of the tunnel barrier layer; a first magnetization induction unit formed on the first pinned layer; a first upper electrode formed on the first magnetization induction unit; a second pinned layer formed on the tunnel barrier layer and facing the first pinned layer; a second magnetization induction unit formed on the second pinned layer and facing the first magnetization induction unit; and a second upper electrode formed on the second magnetization induction unit.

Further, the present invention for achieving the above-described second technical object provides an operating method of a magnetic tunnel junction device including: a magnetic tunnel junction unit forming a magnetic tunnel junction of a free layer, a tunnel barrier layer, and a pinned layer formed on a lower electrode; a magnetization induction unit formed on the magnetic tunnel junction unit, having ferromagnetic coupling and antiferromagnetic coupling, and configured to determine a fixed magnetization of the magnetic tunnel junction unit; and an upper electrode formed on the magnetization induction unit, the operating method including: applying an external magnetic field to align all ferromagnetic layers of the magnetic tunnel junction unit and the magnetization induction unit in a direction of the external magnetic field; and removing the external magnetic field, and aligning magnetization of the pinned layer due to ferromagnetic coupling and antiferromagnetic coupling.

Advantageous Effects

According to the present invention, a direction of magnetization for fixed ends is adjusted with respect to an external magnetic field in the same direction. Further, pinned layers having magnetization states in various directions can be acquired only by applying an external magnetic field in one direction on the same wafer or substrate.

Specifically, when a plurality of magnetic tunnel junction devices are manufactured on the same substrate, adjusting the magnetization of a pinned layer for each device is very difficult work because the external magnetic field cannot be applied only to a specific device. In the case of the present invention, there is an advantage in that the magnetization of the pinned layer can be set according to the convenience of various users with respect to the external magnetic field applied to the substrate or the like in one direction.

DESCRIPTION OF DRAWINGS

FIG. 1 is a cross-sectional view illustrating a magnetic tunnel junction device according to an exemplary embodiment of the present invention.

FIG. 2 is a cross-sectional view for describing an operation of a magnetization induction unit in FIG. 1 according to the exemplary embodiment of the present invention.

FIG. 3 is another cross-sectional view for describing the operation of the magnetization induction unit in FIG. 1 according to the exemplary embodiment of the present invention.

FIG. 4 is a graph illustrating vibrating sample magnetometer (VSM) data of a magnetic tunnel junction device according to Manufacturing Example 1 of the present invention.

FIG. 5 is a graph illustrating vibrating sample magnetometer (VSM) data of a magnetic tunnel junction device according to Manufacturing Example 2 of the present invention.

FIG. 6 is a cross-sectional view illustrating an application example of the magnetic tunnel junction device according to the exemplary embodiment of the present invention.

MODES OF THE INVENTION

Since the present invention may be variously changed and have various forms, specific embodiments will be exemplified in the drawings and described in detail in the text. However, it should be understood that this does not limit the present invention to a specific disclosure, and includes all modifications, equivalents and substitutes included in the spirit and the scope of the present invention. In a description of each drawing, similar reference numerals are used for similar elements.

Unless otherwise defined, all terms used herein, including technical or scientific terms, have the same meaning as generally understood by those skilled in the art. Terms such as terms defined in generally used dictionaries should be interpreted as having meanings consistent with the meanings in the context of the related art, and should not be interpreted in an idealistic or excessively formal sense unless otherwise defined in the present application.

Hereinafter, exemplary embodiments of the present invention will be described in more detail with reference to the accompanying drawings.

Embodiment

FIG. 1 is a cross-sectional view illustrating a magnetic tunnel junction device according to an exemplary embodiment of the present invention.

Referring to FIG. 1, the magnetic tunnel junction device includes a lower electrode 100, a magnetic tunnel junction unit 200, a magnetization induction unit 300, and an upper electrode 400.

The lower electrode 100 is composed of a non-magnetic metal.

The magnetic tunnel junction unit 200 is formed on the lower electrode 100. The magnetic tunnel junction unit 200 has a free layer 210, a tunnel barrier layer 220, and a pinned layer 230. The magnetic tunnel junction unit 200 is a magnetic tunnel junction structure commonly used in the field.

Accordingly, the free layer 210 formed on the lower electrode 100 has perpendicular magnetic anisotropy, and a magnetization direction is changed by a program current flowing through the tunnel bather layer 220 or a program current flowing in parallel with the lower electrode 100. Commonly, a phenomenon in which the magnetization direction is changed in the free layer 210 is expressed as magnetization switching. Hereinafter, an operation of changing the magnetization direction in the free layer 210 is expressed as magnetization switching.

The tunnel barrier layer 220 is provided on the free layer 210, and the pinned layer 230 is provided on the tunnel bather layer 220. The pinned layer 230 and the free layer 210 may be made of the same material such as a CoFe alloy or CoFeB, and both are a ferromagnet.

When a spin transfer torque phenomenon is used, the magnetization switching is performed in the free layer 210 by a program current vertically passing through the tunnel barrier layer 220. When the free layer 210 and the pinned layer 230 have perpendicular magnetic anisotropy, when the magnetization of the free layer 210 and the magnetization of the pinned layer 230 are parallel to each other (in the same direction), the magnetic tunnel junction unit 200 enters a low resistance state.

When spin orbit torque is used for the magnetization switching of the free layer 210, a program current is applied to the lower electrode 100 composed of a non-magnetic heavy metal. Further, as necessary, an external magnetic field parallel to a direction of the program current may be applied to induce the magnetization switching of the free layer 210. In addition, the magnetization switching may be induced by disposing a material causing a magnetoelectric effect under the lower electrode 100. A magnetoelectric effect material may be magnetized by an electric field generated by the current flowing through the lower electrode 100 to form a magnetic field. In addition, the magnetoelectric effect material disposed in a form of a cross bar with the lower electrode 100 easily changes the magnetization of the free layer 210. However, an insulating material of a thin film needs to be disposed between the lower electrode 100 and the magnetoelectric effect material. Bismuth or iron oxide may be used as the magnetoelectric effect material.

The magnetization induction unit 300 is formed on the pinned layer 230 of the magnetic tunnel junction unit 200. The magnetization induction unit 300 determines an alignment direction of the magnetization of the pinned layer 230. The magnetization induction unit 300 has a ferromagnetic coupling induction layer 310, a middle ferromagnetic layer 320, an antiferromagnetic coupling induction layer 330, and an upper ferromagnetic layer 340.

The ferromagnetic coupling induction layer 310 is formed on the pinned layer 230, and the middle ferromagnetic layer 320 is formed on the ferromagnetic coupling induction layer 310.

The pinned layer 230 and the middle ferromagnetic layer 320 perform ferromagnetic coupling (ferro-coupling) due to the ferromagnetic coupling induction layer 310. The ferromagnetic coupling between the pinned layer 230 and the middle ferromagnetic layer 320 is due to a Ruderman-Kittel-Kasuya-Yosida interaction (RKKY interaction). The RKKY interaction relates to a coupling mechanism of electron spins of a localized inner d or f orbital or a nuclear magnetic moment in metal through an interaction of conduction electrons. The probability that the electron spins may be aligned in one direction in the ferromagnet is changed according to a thickness of a specific film which induces the RKKY interaction. Further, the probability that the spin electron has an up spin or a down spin at a particular point is expressed in the form of a wavelength.

Accordingly, the pinned layer 230 and the middle ferromagnetic layer 320 may be antiferromagnetically coupled (antiferro-coupled) or ferromagnetically coupled depending on the material and thickness of the ferromagnetic coupling induction layer 310. In the case of antiferromagnetic coupling, two facing ferromagnets enter an antiparallel state having spins in opposite directions, and in the case of ferromagnetic coupling, two facing ferromagnets enter a parallel state having spins in the same direction.

The pinned layer 230 and the middle ferromagnetic layer 320 are ferromagnetically coupled, and have magnetization states in the same direction due to the ferromagnetic coupling induction layer 310.

The antiferromagnetic coupling induction layer 330 and the upper ferromagnetic layer 340 are formed on the middle ferromagnetic layer 320. The middle ferromagnetic layer 320 and the upper ferromagnetic layer 340 form an antiferromagnetic coupling due to the antiferromagnetic coupling induction layer 330. That is, the middle ferromagnetic layer 320 and the upper ferromagnetic layer 340 have magnetization in opposite directions. The antiferromagnetic coupling of the middle ferromagnetic layer 320 and the upper ferromagnetic layer 340 is mediated by the antiferromagnetic coupling induction layer 330, and is due to the RKKY interaction.

The upper electrode 400 is formed on the upper ferromagnetic layer 340.

The middle ferromagnetic layer 320, the antiferromagnetic coupling induction layer 330, and the upper ferromagnetic layer 340 may induce a giant magnetoresistance effect. That is, a phenomenon in which electrical resistance is changed according to a change of the magnetization state is induced at interfaces of these three types of films because the antiferromagnetic coupling induction layer 330 is formed of a non-magnetic metal material. However, since a resistance change rate becomes smaller than 5%, the degree to which a change in magnetization in the middle ferromagnetic layer 320 and the upper ferromagnetic layer 340 causes a change in resistance is insignificant, and a resistance change effect due to the magnetic tunneling junction by the free layer, the tunnel barrier layer, and the pinned layer is very large.

Accordingly, a resistance state in the magnetic tunnel junction unit is determined by a parallel state or an antiparallel state of magnetization of the free layer and magnetization of the pinned layer.

Further, the magnetization of the pinned layer 230 is controlled by the ferromagnetic coupling or the antiferromagnetic coupling of the middle ferromagnetic layer 320 and the upper ferromagnetic layer 340.

Specifically, the middle ferromagnetic layer 320 has a stronger magnetization intensity than that of the pinned layer 230. To this end, the middle ferromagnetic layer 320 may have a larger thickness than the pinned layer 230.

Further, the magnetization intensity of the upper ferromagnetic layer 340 may be stronger or weaker than the magnetization intensity of the middle ferromagnetic layer 320. However, the upper ferromagnetic layer 340 also has a stronger magnetization intensity than the pinned layer 230.

The upper ferromagnetic layer 340 may have a larger thickness than the middle ferromagnetic layer 320 to have a stronger magnetization intensity than the middle ferromagnetic layer 320. Further, the upper ferromagnetic layer 340 may have a smaller thickness than the middle ferromagnetic layer 320 to have a weaker magnetization intensity than the middle ferromagnetic layer 320.

FIG. 2 is a cross-sectional view for describing an operation of the magnetization induction unit in FIG. 1 according to the exemplary embodiment of the present invention.

Referring to FIG. 2, the upper ferromagnetic layer 340 has a stronger magnetization intensity than the middle ferromagnetic layer 320. Further, the pinned layer 230 and the middle ferromagnetic layer 320 are ferromagnetically coupled by the ferromagnetic coupling induction layer 310, and the middle ferromagnetic layer 320 and the upper ferromagnetic layer 340 are antiferromagnetically coupled by the antiferromagnetic coupling induction layer 330. Since the upper ferromagnetic layer 340 has a stronger magnetization intensity than the middle ferromagnetic layer 320, the middle ferromagnetic layer 320 has magnetization in a direction opposite the magnetization of the upper ferromagnetic layer 340 due to the magnetization of the upper ferromagnetic layer 340.

When an external magnetic field H is applied in an upward direction, the magnetization of all magnetic materials is set in the upward direction. That is, the magnetization directions of all ferromagnets are directed upward due to a strong magnetic field capable of overcoming the antiferromagnetic coupling between the middle ferromagnetic layer 320 and the upper ferromagnetic layer 340.

Subsequently, when the external magnetic field H is removed, antiferromagnetic coupling is realized between the middle ferromagnetic layer 320 and the upper ferromagnetic layer 340. However, since the upper ferromagnetic layer 340 has a strong magnetic property (magnetization), even when an antiferromagnetic coupling force is applied, the magnetization direction of the upper ferromagnetic layer 340 is not changed, and a magnetization switching operation in which the magnetization direction of the middle ferromagnetic layer 320 is directed downward is performed. Accordingly, the magnetization of the middle ferromagnetic layer 320 is stabilized by the antiferromagnetic coupling.

Further, the middle ferromagnetic layer 320 and the pinned layer 230 form a ferromagnetic coupling. Since the middle ferromagnetic layer 320 has a larger magnetization than the pinned layer 230, the magnetization direction of the pinned layer 230 is determined by the magnetization direction of the middle ferromagnetic layer 320. The magnetization of the pinned layer 230 is aligned downward through the above-described mechanism.

When the external magnetic field H is directed downward, the magnetization direction of the ferromagnets is directed downward due to the strong magnetic field. Further, when the external magnetic field H is removed, the upper ferromagnetic layer 340, which is magnetized the strongest, maintains the downward magnetization. The magnetization of the middle ferromagnetic layer 320 is aligned to be directed upward by the antiferromagnetic coupling.

Further, since the middle ferromagnetic layer 320 and the pinned layer 230 perform the ferromagnetic coupling, the magnetization of the pinned layer 230 is aligned in the same direction as the magnetization direction of the middle ferromagnetic layer 320. Accordingly, the magnetization direction of the pinned layer 230 is aligned to be directed upward.

FIG. 3 is another cross-sectional view for describing the operation of the magnetization induction unit in FIG. 1 according to the exemplary embodiment of the present invention.

Referring to FIG. 3, the upper ferromagnetic layer 340 has a smaller magnetization intensity than the middle ferromagnetic layer 320. To this end, the upper ferromagnetic layer 340 may have a smaller thickness than the middle ferromagnetic layer 320.

When the external magnetic field H is applied in the upward direction, the magnetization of all magnetic materials is directed upward.

Subsequently, when the external magnetic field H is removed, the middle ferromagnetic layer 320 having the strongest magnetization intensity maintains a magnetization directed upward, and the upper ferromagnet layer 340 has a magnetization directed downward due to the antiferromagnetic coupling. Further, the pinned layer 230 has a magnetization directed upward due to the ferromagnetic coupling.

In addition, when the external magnetic field H is removed after the external magnetic field H is applied in the downward direction, each of the middle ferromagnetic layer 320 and the pinned layer 230 has downward magnetization.

As described above, the magnetization induction unit 300 is composed of two types of ferromagnetic layers having different types of magnetization intensity, and a single film or single type of ferromagnetic layer is not used in the magnetization induction unit 300 to induce the magnetization of the pinned layer. Further, when the external magnetic field is applied, the magnetization direction of the pinned layer 230 may be differently set by adjusting the magnetization intensity between the middle ferromagnetic layer 320 and the upper ferromagnetic layer 340.

Manufacturing Example 1: Manufacturing and Performance Evaluation of Magnetic Tunnel Junction Device $SiO_2$ is used as the substrate. W (tungsten) is used as the lower electrode on the substrate. A thickness of W does not affect performance of the magnetic tunnel junction device and thus was not evaluated. Further, Ta or $W_3Ta$ may be used as the lower electrode. A seed layer is formed on the lower electrode, and the seed layer includes Ta and has a thickness of 5 nm. Due to the seed layer, the free layer may be grown as a crystal. The free layer is formed on the seed layer, and CoFeB is formed to a thickness of 1.2 nm to 1.3 nm. As the tunnel barrier layer, MgO is formed to a thickness of 1.15 nm. CoFeB is formed to a thickness of 1 nm as the pinned layer on the tunnel barrier layer.

The material of the ferromagnetic coupling induction layer is Ta and the ferromagnetic coupling induction layer has a thickness of 0.35 nm. The middle ferromagnetic layer formed on the ferromagnetic coupling induction layer has a structure of $[Co(0.4\ nm)/Pt\ (0.3\ nm)]_6$. That is, a stacked structure of Co having a thickness of 0.4 nm and Pt having a thickness of 0.3 nm is repeatedly formed in six layers. As the antiferromagnetic coupling induction layer formed on the middle ferromagnetic layer, Ru with a thickness of 0.85 nm is used. $[Co\ (0.4\ nm)/Pt\ (0.3\ nm)]_{12}$ is used as the upper ferromagnetic layer on the antiferromagnetic coupling induction layer. That is, a stacked structure of Co having a thickness of 0.4 nm and Pt having a thickness of 0.3 nm is repeatedly formed in twelve layers. Ta (0.5 nm)/Ru is used as the upper electrode on the upper ferromagnetic layer. The above-described structure exhibits the structure in FIG. 2 in which the magnetization intensity of the upper ferromagnetic layer is set to be larger than that of the middle ferromagnetic layer.

FIG. 4 is a graph illustrating vibrating sample magnetometer (VSM) data of a magnetic tunnel junction device according to Manufacturing Example 1 of the present invention.

Referring to FIG. 4, when an external magnetic field is applied at 4 kOe in an upward direction, all of a free layer, a pinned layer, a middle ferromagnetic layer, and an upper ferromagnetic layer are magnetized in the upward direction.

In FIG. 4, only magnetization directions of the free layer, the pinned layer, the middle ferromagnetic layer, and the upper ferromagnetic layer are simply shown. That is, other functional films are omitted for convenience of description. Accordingly, the lowermost layer is the free layer, a layer on the lowermost layer is the pinned layer, and the magnetization direction of the middle ferromagnetic layer is indicated on the pinned layer. The uppermost layer shows the magnetization direction of the upper ferromagnetic layer.

After the external magnetic field has the highest value, when the external magnetic field is gradually decreased, a magnetic moment abruptly drops at approximately 1.5 kOe because magnetization switching occurs in the middle ferromagnetic layer by antiferromagnetic coupling between the middle ferromagnetic layer and the upper ferromagnetic layer. Further, the alignment of downward magnetization of the pinned layer is performed by ferromagnetic coupling with the middle ferromagnetic layer. Since the magnetization direction is determined by the external magnetic field, the free layer maintains upward magnetization.

Subsequently, when the external magnetic field is applied with a negative value of 0 kOe or less and the external magnetic field is directed downward, the free layer has downward magnetization. A state of the magnetization is maintained up to −2 kOe. That is, it can be seen that the external magnetic field applied in the section does not induce a magnetic moment capable of overcoming the antiferromagnetic coupling.

When the external magnetic field becomes −2 kOe or less, the external magnetic field overcomes the antiferromagnetic coupling and converts the magnetization of all ferromagnets to the downward direction. Accordingly, the magnetic moment also has a value of approximately −1500 μemu.

When the external magnetic field is gradually increased from −4 kOe, the magnetic moment rises to −500 μemu at approximately −1.5 kOe because the antiferromagnetic coupling overcomes the external magnetic field, and thus magnetization switching occurs in the middle ferromagnet layer in the upper direction. According to the magnetization switching of the middle ferromagnet layer, the pinned layer forming the ferromagnetic coupling also forms upward magnetization. Further, the free layer at a lower portion maintains downward magnetization by a downward external magnetic field.

Even when an upward magnetic field having a (+) value is applied as the external magnetic field increases, the upper ferromagnetic layer which has the strongest magnetization maintains the downward magnetization. However, the free layer has upward magnetization due to the external magnetic field.

When the external magnetic field further increases and reaches approximately 2 kOe, the upper ferromagnetic layer has the upward magnetization due to the strong external magnetic field. Further, the antiferromagnetic coupling between the upper ferromagnetic layer and the middle ferromagnetic layer does not affect the magnetization of the ferromagnet, and all ferromagnetic layers have upward magnetization.

As described above, the pinned layer may be set to a downward magnetization state or upward magnetization state by the external magnetic field.

Manufacturing Example 2: Manufacturing and Performance Evaluation of Magnetic Tunnel Junction Device A composition and a thickness of the magnetic tunnel junction unit are the same as those shown in Manufacturing Example 1. Further, a configuration of a magnetization induction unit is the same as that of the magnetization induction unit described in Manufacturing Example 1, but a thickness of an upper ferromagnetic layer is different from a thickness of the upper ferromagnetic layer described in Manufacturing Example 1. [Co (0.4 nm)/Pt (0.3 nm)]$_3$ is used as the upper ferromagnetic layer. That is, a stacked structure of Co having a thickness of 0.4 nm and Pt having a thickness of 0.3 nm is repeatedly formed in three layers. Accordingly, a thickness of a middle ferromagnetic layer is larger than the thickness of the upper ferromagnetic layer. This shows the magnetic tunnel junction device disclosed in FIG. 3. Further, Ta (0.5 nm)/Ru is used as an upper electrode on the upper ferromagnetic layer.

FIG. 5 is a graph illustrating vibrating sample magnetometer (VSM) data of a magnetic tunnel junction device according to Manufacturing Example 2 of the present invention.

In FIG. 5, only magnetization directions of a free layer, a pinned layer, a middle ferromagnetic layer, and an upper ferromagnetic layer are disclosed like FIG. 4, and the remaining functional films are omitted for convenience of description.

Referring to FIG. 5, when an external magnetic field is applied at 4 kOe in an upward direction, all ferromagnets constituting the magnetic tunnel junction device have upward magnetization. That is, despite the influence of antiferromagnetic coupling between the middle ferromagnetic layer and the upper ferromagnetic layer, all ferromagnets have the upward magnetization due to a strong external magnetic field.

When the external magnetic field becomes approximately 2.8 kOe, only the upper ferromagnetic layer has downward magnetization due to the antiferromagnetic coupling. Magnetization switching of the upper ferromagnetic layer is due to the fact that the antiferromagnetic coupling is stronger than ferromagnetic coupling, and it can be seen through the fact that a thickness of the upper ferromagnetic layer is larger than a thickness of a second pinned layer.

Subsequently, when the external magnetic field decreases and thus becomes smaller than 0 kOe, magnetization switching due to the external magnetic field occurs in the free layer. Accordingly, the free layer has downward magnetization.

When the external magnetic field decreases to approximately −1 kOe or less, the ferromagnetic coupling, which has a weaker coupling force compared to the antiferromagnetic coupling, is decoupled, and the magnetization direction of the pinned layer is determined by the external magnetic field. Accordingly, the pinned layer has downward magnetization.

Subsequently, when the external magnetic field continuously increases in a negative direction, and becomes a value of −3.2 kOe or less, the strong external magnetic field induces magnetization switching of the middle ferromagnetic layer despite the antiferromagnetic coupling. Accordingly, the middle ferromagnetic layer has downward magnetization, and the upper ferromagnetic layer also maintains the downward magnetization due to the external magnetic field. Accordingly, all ferromagnetic layers have downward magnetization.

When the external magnetic field gradually increases from −4 kOe and reaches approximately −2.5 kOe, the strong antiferromagnetic coupling induces the magnetization switching of the upper ferromagnetic layer by excluding the influence of the external magnetic field. Accordingly, the upper ferromagnetic layer has the upward magnetization, and the other magnetic layers have the downward magnetization.

When the external magnetic field further increases and reaches approximately 0.3 kOe, a magnetic moment abruptly increases because the magnetization of the free layer is switched to an upward direction by the external magnetic field.

Subsequently, when the external magnetic field becomes 1 kOe or more, the magnetic moment has a value of 500 μemu. The magnetic moment sharply increases because the magnetization of the pinned layer which participates in the ferromagnetic coupling having a relatively weak force compared to the antiferromagnetic coupling is switched by external magnetic field. Accordingly, the pinned layer and the free layer have upward magnetization, and the upper ferromagnetic layer maintains the upward magnetization. Further, the middle ferromagnetic layer has the strongest magnetization, and thus maintains the downward magnetization despite the external magnetic field.

When the external magnetic field becomes approximately 3.3 kOe or more, all ferromagnets have the upward magnetization due to the strong magnetic field.

When the magnetization direction is set by the strong external magnetic field and then the external magnetic field is removed in the above-described operation of the magnetic tunnel junction device in FIG. 5, it can be seen that the pinned layer has the downward magnetization or the upward magnetization according to a direction of the external magnetic field. Further, since a hysteresis characteristic appears, it can be seen that a magnetization state of the pinned layer constantly maintains the magnetization state despite the influence of the external magnetic field.

FIG. 6 is a cross-sectional view illustrating an application example of the magnetic tunnel junction device according to the exemplary embodiment of the present invention.

Referring to FIG. 6, the magnetic tunnel junction device has a free layer 210 and a tunnel barrier layer 220 on a lower electrode 100. Further, the magnetic tunnel junction device has a first pinned layer 231 and a second pinned layer 232 separated from each other on the tunnel barrier layer 220. The structure is a structure in which two pinned layers 231 and 232 are formed on one free layer 210, and may store two states using the one free layer 210.

As described in FIGS. 1 to 3, a first magnetization induction unit 301 is formed on the first pinned layer 231, and a first upper electrode 410 is formed on the first magnetization induction unit 301. Further, the configuration and operation of the first magnetization induction unit 301 are the same as those described in FIG. 2.

That is, the first magnetization induction unit 301 has a first ferromagnetic coupling induction layer 311, a first middle ferromagnetic layer 321, a first antiferromagnetic coupling induction layer 331, and a first upper ferromagnetic layer 341 formed on the first pinned layer 231. Further, the first upper ferromagnetic layer 341 has a larger magnetization intensity than the first middle ferromagnetic layer 321. Accordingly, when the external magnetic field is removed, a magnetization direction of the first upper ferromagnetic layer 341 is not changed, and the first middle ferromagnetic layer 321 has a magnetization state in a direction opposite that of the first upper ferromagnetic layer 341.

Further, the first pinned layer 231 is ferromagnetic ally coupled to the first middle ferromagnetic layer 321, and thus has a magnetization in the same direction as a magnetization direction of the first middle ferromagnetic layer 321.

In addition, a second magnetization induction unit 302 is formed on the second pinned layer 232, and a second upper electrode 420 is formed on the second magnetization induction unit 302. The configuration and operation of the second magnetization induction unit 302 are the same as those described in FIG. 3.

Accordingly, the second magnetization induction unit 302 has a second ferromagnetic coupling induction layer 312, a second middle ferromagnetic layer 322, a second antiferromagnetic coupling induction layer 332, and a second upper ferromagnetic layer 342 formed on the second pinned layer 232.

Since the second middle ferromagnetic layer 322 has a stronger magnetization intensity than the second upper ferromagnetic layer 342, a magnetization direction of the second middle ferromagnetic layer 322 is not changed when the external magnetic field is removed, and the second pinned layer 232 has a magnetization state in the same direction as that of the second middle ferromagnetic layer 322 due to the ferromagnetic coupling.

Further, as shown in FIG. 6, the first pinned layer 231 and the second pinned layer 232 face each other, and the first magnetization induction unit 301 and the second magnetization induction unit 302 are also disposed to face each other.

When the external magnetic field is directed in a direction toward the lower electrode, the first pinned layer 231 has upward magnetization and the second pinned layer 232 has downward magnetization. This is a description of the magnetization of the pinned layers 231 and 232 in a state in which a strong external magnetic field directed downward is applied and the external magnetic field is removed. That is, even when the external magnetic field in one direction is applied, two pinned layers 231 and 232 which share the free layer 210 have fixed magnetization states in opposite directions from each other.

Subsequently, a program current $i_O$ is applied in a direction parallel to the lower electrode 100 using the spin orbit torque. It is assumed that the free layer 210 has upward magnetization due to the program current $i_O$ flowing in the right direction. Further, it is assumed that the free layer 210 has downward magnetization when the program current $i_O$ flows in the left direction.

Since the program current $i_O$ flows in the right direction in FIG. 6, the free layer 210 has upward magnetization. Since the first pinned layer 231 and the free layer 210 have magnetization in the same direction, a low resistance state is realized, and since the second pinned layer 232 and the free layer 210 have magnetization in opposite directions, a high resistance state is realized.

That is, two storage states may be implemented for application of one program current $i_O$, and when the resistance states of the first pinned layer 231 and the free layer 210 are used as buffers, the resistance state of the free layer 210 and the second pinned layer 232 having an inverted state may be used as an inverter.

When the magnetic tunnel junction device in FIG. 6 uses the spin transfer torque, the magnetization of the free layer 210 may be set by applying program currents in the same direction from the upper electrodes 410 and 420 to the lower electrode 100. The operation is the same as described above.

In the present invention described above, directions of magnetization for pinned layers are adjusted with respect to the external magnetic field in the same direction. Further, the pinned layers having magnetization states in various directions may be acquired only by applying the external magnetic field in one direction on the same wafer or substrate.

Specifically, when a plurality of magnetic tunnel junction devices are manufactured on the same substrate, adjusting the magnetization of the pinned layer for each device is very difficult work because the external magnetic field may not be applied only to a specific device. In the present invention, there is an advantage in that the magnetization of the pinned layer may be set according to the convenience of various users with respect to the external magnetic field applied to the substrate or the like in one direction.

The invention claimed is:

1. A magnetic tunnel junction device comprising:
   a magnetic tunnel junction unit forming a magnetic tunnel junction of a free layer, a tunnel barrier layer, and a pinned layer formed on a lower electrode;
   a magnetization induction unit formed on the magnetic tunnel junction unit, having ferromagnetic coupling and antiferromagnetic coupling, and configured to determine a pinned magnetization of the magnetic tunnel junction unit; and
   an upper electrode formed on the magnetization induction unit.

2. The magnetic tunnel junction device of claim 1, wherein the magnetization induction unit includes:
   a ferromagnetic coupling induction layer formed on the pinned layer;
   a middle ferromagnetic layer formed on the ferromagnetic coupling induction layer, and forming ferromagnetic coupling together with the pinned layer;
   an antiferromagnetic coupling induction layer formed on the middle ferromagnetic layer; and
   an upper ferromagnetic layer formed on the antiferromagnetic coupling induction layer, and forming antiferromagnetic coupling with the middle ferromagnetic layer.

3. The magnetic tunnel junction device of claim 2, wherein a magnetization intensity of the upper ferromagnetic layer is stronger than a magnetization intensity of the middle ferromagnetic layer,
   a magnetization direction of the upper ferromagnetic layer is not changed by removal of an external magnetic field, and
   a magnetization direction of the middle ferromagnetic layer is opposite the magnetization direction of the upper ferromagnetic layer.

4. The magnetic tunnel junction device of claim 3, wherein a thickness of the upper ferromagnetic layer is larger than a thickness of the middle ferromagnetic layer.

5. The magnetic tunnel junction device of claim 2, wherein a magnetization intensity of the upper ferromagnetic layer is weaker than a magnetization intensity of the middle ferromagnetic layer,
  a magnetization direction of the middle ferromagnetic layer is not changed by removal of an external magnetic field, and
  a magnetization direction of the upper ferromagnetic layer is opposite the magnetization direction of the middle ferromagnetic layer.

6. The magnetic tunnel junction device of claim 5, wherein a thickness of the upper ferromagnetic layer is smaller than a thickness of the middle ferromagnetic layer.

7. A magnetic tunnel junction device comprising:
  a free layer formed on a lower electrode;
  a tunnel barrier layer formed on the free layer;
  a first pinned layer formed at one side of the tunnel barrier layer;
  a first magnetization induction unit formed on the first pinned layer;
  a first upper electrode formed on the first magnetization induction unit;
  a second pinned layer formed on the tunnel barrier layer, and facing the first pinned layer;
  a second magnetization induction unit formed on the second pinned layer, and facing the first magnetization induction unit; and
  a second upper electrode formed on the second magnetization induction unit.

8. The magnetic tunnel junction device of claim 7, wherein the first magnetization induction unit includes:
  a first ferromagnetic coupling induction layer formed on the first pinned layer;
  a first middle ferromagnetic layer formed on the first ferromagnetic coupling induction layer, and forming ferromagnetic coupling together with the first pinned layer;
  a first antiferromagnetic coupling induction layer formed on the first middle ferromagnetic layer; and
  a first upper ferromagnetic layer formed on the first antiferromagnetic coupling induction layer, and forming antiferromagnetic coupling together with the first middle ferromagnetic layer,
  wherein the first upper ferromagnetic layer has a stronger magnetization intensity than the first middle ferromagnetic layer.

9. The magnetic tunnel junction device of claim 8, wherein the first upper ferromagnetic layer has a larger thickness than the first middle ferromagnetic layer,
  a magnetization direction of the first upper ferromagnetic layer is not changed when an external magnetic field is removed, and
  a magnetization direction of the first middle ferromagnetic layer is opposite the magnetization direction of the first upper ferromagnetic layer due to the antiferromagnetic coupling.

10. The magnetic tunnel junction device of claim 7, wherein the second magnetization induction unit includes:
  a second ferromagnetic coupling induction layer formed on the second pinned layer;
  a second middle ferromagnetic layer formed on the second ferromagnetic coupling induction layer, and forming ferromagnetic coupling together with the second pinned layer;
  a second antiferromagnetic coupling induction layer formed on the second middle ferromagnetic layer; and
  a second upper ferromagnetic layer formed on the second antiferromagnetic coupling induction layer, and forming antiferromagnetic coupling together with the second middle ferromagnetic layer,
  wherein the second middle ferromagnetic layer has a stronger magnetization intensity than the second upper ferromagnetic layer.

11. The magnetic tunnel junction device of claim 10, wherein the second middle ferromagnetic layer has a larger thickness than the second upper ferromagnetic layer,
  a magnetization direction of the second middle ferromagnetic layer is not changed when an external magnetic field removed, and
  a magnetization direction of the second upper ferromagnetic layer is opposite the magnetization direction of the second middle ferromagnetic layer due to the antiferromagnetic coupling.

12. An operating method of a magnetic tunnel junction device including a magnetic tunnel junction unit forming a magnetic tunnel junction of a free layer, a tunnel barrier layer, and a pinned layer formed on a lower electrode, a magnetization induction unit formed on the magnetic tunnel junction unit, having ferromagnetic coupling and antiferromagnetic coupling, and configured to determine a pinned magnetization of the magnetic tunnel junction unit, and an upper electrode formed on the magnetization induction unit, the operating method comprising:
  applying an external magnetic field to align magnetization of all ferromagnetic layers of the magnetic tunnel junction unit and the magnetization induction unit in a direction of the external magnetic field; and
  removing the external magnetic field, and aligning magnetization of the pinned layer due to ferromagnetic coupling and antiferromagnetic coupling.

13. The method of claim 12, wherein the magnetization induction unit includes:
  a ferromagnetic coupling induction layer formed on the pinned layer;
  a middle ferromagnetic layer formed on the ferromagnetic coupling induction layer, and forming ferromagnetic coupling together with the pinned layer;
  an antiferromagnetic coupling induction layer formed on the middle ferromagnetic layer; and
  an upper ferromagnetic layer formed on the antiferromagnetic coupling induction layer, and forming antiferromagnetic coupling together with the middle ferromagnetic layer, and
  wherein the upper ferromagnetic layer and the middle ferromagnetic layer have magnetization states in directions opposite to each other due to the antiferromagnetic coupling, and the middle ferromagnetic layer and the pinned layer have magnetization states in the same direction when the external magnetic field is removed.

14. The method of claim 13, wherein a magnetization direction of the upper ferromagnetic layer is not changed by removal of the external magnetic field,
  a magnetization direction of the middle ferromagnetic layer is switched by the antiferromagnetic coupling, and
  a magnetization direction of the pinned layer is the same as that of the middle ferromagnetic layer.

15. The method of claim 13, wherein a magnetization direction of the middle ferromagnetic layer is not changed by removal of the external magnetic field,
  a magnetization direction of the upper ferromagnetic layer is switched by the antiferromagnetic coupling, and a magnetization direction of the pinned layer is the same as that of the middle ferromagnetic layer.

16. The method of claim 12, further comprising applying a program current in a direction parallel to the lower electrode to perform magnetization switching of the free layer after aligning the magnetization of the pinned layer.

17. The method of claim 12, further comprising applying a program current between the upper electrode and the lower electrode to perform magnetization switching of the free layer after aligning the magnetization of the pinned layer.

* * * * *